United States Patent

[11] 3,549,782

[72] Inventor Harry C. Reifel
Topsfield, Mass.
[21] Appl. No. 720,738
[22] Filed Apr. 11, 1968
[45] Patented Dec. 22, 1970
[73] Assignee Unitrode Corporation
Watertown, Mass.
a corporation of Maryland

[54] SUBASSEMBLY PACKAGE
6 Claims, 6 Drawing Figs.

[52] U.S. Cl. .......... 174/52, 29/588, 29/627, 317/100, 317/101, 317/234
[51] Int. Cl. .......... H05k 5/06
[50] Field of Search .......... 174/52.5, 52.6, 50.5, 68.5, FP; 317/101A, 101CP, 101CC, 100, 234/54, 234/4; 29/588–591, 626, 627

[56] References Cited
UNITED STATES PATENTS

| | | | |
|---|---|---|---|
| 3,374,537 | 3/1968 | Doelp, Jr. .......... | 174/FP |
| 3,344,316 | 9/1967 | Stelmak .......... | 317/101CC |

*Primary Examiner*—Darrell L. Clay
*Attorney*—Joseph Weingarten

ABSTRACT: A subassembly for mounting a semiconductor device and which provides an efficient mechanical, electrical and thermal package therefor especially suitable for connection to etched or film circuits. The package includes an electrically conductive base member having one or more insulative pedestals formed thereon, to which flexible conductive leads are attached. A semiconductor device mounted on the base member and connected to the leads can be easily manipulated for purposes of testing and subsequent insertion in a circuit or another package.

INVENTOR
HARRY C. REIFEL
BY Joseph Weingarten
Stanley M. Schurgin
ATTORNEYS

SUBASSEMBLY PACKAGE

FIELD OF THE INVENTION

This invention relates to packaging of electronic components and more particularly to a subassembly package for semiconductor devices which is adapted for subsequent incorporation into a complete circuit.

BACKGROUND OF THE INVENTION

With the advent of modern microcircuit techniques, it is now common to form complete circuits in planar format on a small substrate board. Such microcircuits often comprise a substrate having conductive and resistive paths deposited thereon in a selected pattern, and a plurality of discrete devices and subcircuits which are attached to selected points in the circuit to provide the intended circuit configuration. Conventionally, active semiconductor devices, such as diodes, transistors, thyristors and integrated circuits, are incorporated in a complete circuit either in unencapsulated form or in individual device packages. Unencapsulated devices, which comprise extremely small semiconductor chips, are exceedingly fragile and, by reason of their small size, are quite difficult to manipulate for testing and for incorporation into a circuit. By reason of this difficulty of manipulation, such active devices are often mounted in a circuit before they are fully tested, and, in the event that a device is found defective, it must be removed from the circuit by the use of skilled labor, and at the expense of possible damage to the surrounding circuitry. In some instances, the labor required to remove a defective device is not warranted by reason of the cost and time involved, and a circuit with a defective device is simply discarded, which, of course, detracts from the economics of the is situation. Individual chips can be more easily handled and protected from damage by individual packaging; however, conventional packages are not of a configuration which allows their efficient use in modern planar microcircuits. One well known semiconductor package includes a cylindrical metal header through which leads are hermetically sealed, the chip being mounted on the header and electrical connection being made by wires interconnecting the chip to the leads. Such headers are relatively expensive to fabricate and are not of a physical configuration compatible with planar microcircuits. It would be advantageous to have, and it is an object of this invention to provide, a package for semiconductor devices which is physically compatible with microcircuits and which allows the efficient manipulation of semiconductor devices for purposed o purposes of testing, matching, and for later interconnection into planar microcircuits.

SUMMARY OF THE INVENTION

In accordance with the present invention, a subassembly package is provided which can be fabricated in production volume and at rather low cost in a continuous strip which can be cut at selected intervals to provide individual subassembly packages. A semiconductor device can be mounted, according to the invention, in the package in a manner which allows easily handling and testing of the device. As a particular feature of the invention, the subassembly package is compatible in size and physical format with planar microcircuits. The novel package includes an electrically conductive base member having one or more pedestals of insulative material on a surface thereof with flexible conductive leads being attached to the raised surfaces of these pedestals. A semiconductor device can be mounted on the base member with the terminal wires of the device being connected to respective conductive leads of the package. The package is of a size and configuration so that it can be conveniently handled during testing operations and during its mounting in a complete circuit.

To incorporate the novel package in circuit, the conductive base member of the package is intimately attached to a conductive area suitably formed on an etched or deposited circuit, and the flexible leads are connected to selected points in the circuit. The conductive base member can be thermally massive with respect to the small semiconductor chip affixed thereto and this base member can therefore provide an efficient heat sink for the semiconductor device. Further, the electrically conductive base member can function as one terminal of the device in addition to providing an efficient mechanical and thermal mounting. The subassembly package is substantially planar in configuration and is fully compatible with the planar format of etched or film circuits. After a semiconductor device is mounted in a subassembly package according to the invention, a temporary or permanent encapsulant of plastic or other suitable material can be applied to further protect the device from possible contamination and mechanical damage during later handling of the package. If the complete circuit is to be encapsulated, the encapsulant on an individual package may be removed prior to encapsulation of the overall circuit. If, however, the complete circuit is not to be encapsulated, the individual package encapsulant can remain to provide the intended protection.

DESCRIPTION OF THE DRAWINGS

The invention will be more fully understood from the following detailed description, taken in conjunction with the accompanying drawings, in which.

DETAILED DESCRIPTION OF THE INVENTION

Figure 1:
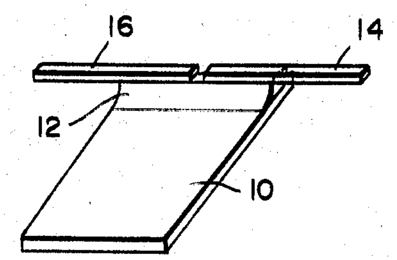
FIG. 1 is a pictorial view of a subassembly package according to the invention.

Referring to FIG. 1, there is shown a subassembly package including a flat base member 10 formed of an electrically conductive material and having formed along one edge of the top surface thereof a pedestal 12 of electrically insulative material. First and second flexible lead wires 14 and 16 each have one end connected to the top surface of pedestal 12, and the other end extending away from base 10. The base is typically made of Kovar and the top surface of this base is usually gold-plated, for reasons which will be explained hereinbelow. Pedestal 12 is formed of a suitable material to insulate the lead wires from the conductive base 10. The lead wires are typically formed of copper or Kovar and are of ribbonlike form so that they may be bent to a desired configuration for interconnection in a circuit. The pedestal 12 is typically of a vitreous material such as glass or ceramic or of a suitable plastic material and can be tinned or metallized with brazing alloys such as copper-silver, gold-silver or gold-copper on its top and bottom surfaces to facilitate its attachment to base 10 and to leads 14 and 16. For example, to assemble the package of FIG. 1, the pedestal 12 having a metallized bottom surface is placed in the required location on base 10 and sufficient heat applied to affect a braze bond between the pedestal and the base. Similarly, leads 14 and 16 can be brazed to the metallized top surface of pedestal 12. Alternatively, the leads and base member can be metallized rather than the pedestal. Of course, it is not required that the mating components be metallized as described hereinabove, since it should be evident that the pedestal can also be attached to the base, and the leads in turn attached to the pedestal, by any one of several well known means, for example, by an adhesive.

Figure 2:
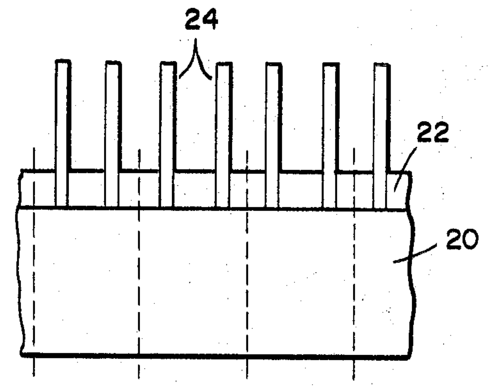
FIG. 2 is a top view, partly broken away, of a packaging strip from which subassemblies according to the invention are made.

It is a major feature of the invention that the subassembly package can be fabricated, at relatively low cost, in a continuous strip which can then be cut at selected intervals to provide individual packages. As seen in FIG. 2, a strip of electrically conductive material 20 has an insulative pedestal 22 affixed along an edge thereof, with a plurality of lead wires 24 attached to the top surface of pedestal 22. As discussed hereinabove, the pedestal can be formed of any suitable electrically insulative material such as ceramic or glass and can have its upper and lower surfaces metallized with a brazing material so that the pedestal can be secured to the leads and to the base by low temperature bonding. To assemble the structure of FIG. 2, the pedestal 22 is placed in the requisite location on a surface of base 20 and is attached thereto by brazing. Leads 24 are then placed along the top surface of pedestal 22 and are secured thereto again by brazing. Individual packages can then be cut from this strip as illustrated by the dashed lines in FIG. 2 to provide individual packages.

Figure 3:
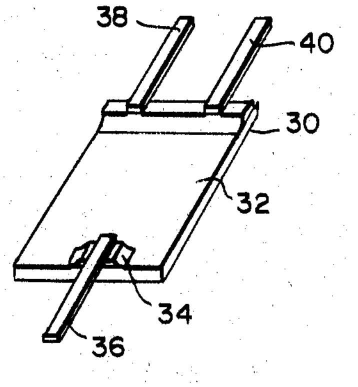
FIG. 3 is a pictorial view of an alternative subassembly package according to the invention.

The insulated pedestal can be placed in any location on the base to suit particular requirements, and more than one pedestal can be employed in particular instances, as required. A package according to the invention is illustrated in FIG. 3 wherein two insulative pedestals are employed on a conductive base member. Referring to FIG. 3, a first pedestal 30 is shown attached along one edge of base 32, while a second pedestal 34 is shown attached to the center portion of the opposite edge of base 32. One lead wire 36 is affixed to the top surface of pedestal 34, while a pair of lead wires 38 and 40 are connected to the top surface of pedestal 30. In this embodiment, the three lead wires 36, 38 and 40 extend outwardly from the base 32 in a direction transverse to the edges containing the supporting pedestals. Of course, it is clear that the lead wires can extend in any direction from the base to suit particular needs.

Figure 4:
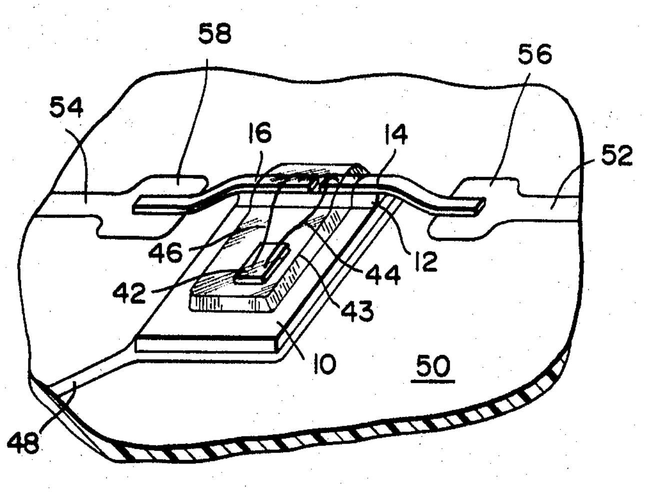
FIG. 4 is a pictorial view, partly broken away, illustrating the connection of a subassembly package according to the invention in a microcircuit.

The connection of a semiconductor device into a package according to the invention, and the subsequent connection of this package containing the semiconductor device into an associated circuit is illustrated in FIG. 4. The subassembly package is like that illustrated in FIG. 1 and includes a conductive base 10 having attached thereto a semiconductor body 42 which has a pair of lead wires 44 and 46 connected, respectively, to leads 14 and 16 on pedestal 12. The illustrated semiconductor device is a three terminal device, such as a transistor or thyristor and can be affixed to the gold plated surface of base member 10 by silicon-gold scrubbing. An encapsulant 43 can be formed over semiconductor body 42 and over lead wires 44 and 46 to further protect the device from possible damage by mechanical shock or contamination as it is being handled. For clarity of illustration, the encapsulant is shown as being transparent. This encapsulant may be left over the device after it is mounted in a circuit or, as mentioned hereinabove, it may be removed in the event that the overall circuit, in which the subassembly is incorporated, is subsequently encapsulated. Such a temporary encapsulant can be a material, for example polystyrene, which is removable by a suitable solvent such as acetone.

The electrically conductive base member 10 is affixed to an enlarged portion of a conductive path 48 formed on an insulated circuit board 50, this enlarged portion of path 48 conforming to the shape and dimensions of base 10. The base member can be affixed to conductive path 48 by any well known means such as by soldering. Leads 14 and 16 are connected to respective conductive paths 52 and 54, also formed on circuit board 50. Conductive paths 52 and 54 typically have enlarged end portions 56 and 58 to accommodate the corresponding leads of the subassembly package.

A semiconductor device packaged according to the invention is easily handled for purposes of testing and subsequent insertion into an associated circuit. The conductive base member and the package leads are relatively large compared with the device itself and the device lead wires. This subassembly can, therefore, be manipulated with relative ease and with little chance of damage to the delicate semiconductor device mounted thereon. As is evident from FIG. 4, the subassembly package containing the semiconductor device is substantially planar in configuration and lends itself to incorporation into etched or deposited circuits which are of similar planar format. The inherent planar nature of modern etched or deposited circuits is thereby retained by use of the novel packaging arrangement, which at the same time also provides a rugged and efficient mounting for the active devices. It is a feature of the invention that the subassembly base member is electrically conductive and can be conductively attached to a circuit path provided on a circuit board with which it is employed. The conductive base member can thereby serve as an electrical terminal for the device mounted thereon. Furthermore, the base member can be highly thermally conductive and provide an efficient thermal structure for the effective dissipation of heat from the device to the mounting structure. For example, heat generated by the semiconductor device is conducted to the relatively massive base member and thence to the circuit board on which the subassembly package is intimately mounted to effectively dissipate heat from the device.

Figure 5:
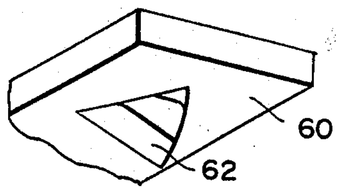
FIG. 5 is a partly broken away pictorial view of a lead wire useful in the present invention.

The leads from the subassembly package, such as leads 14 and 16 in FIG. 4, are usually soldered to their corresponding conductive paths on the circuit board. However, it may be desirable mechanically attach the leads to their associated conductive paths before the soldering operation. In this event, a lead 60 of the type illustrated in FIG. 5 can be employed, this lead including a prong 62 formed in the distal end thereof. This prong is capable of puncturing the conductive path with which it is associated, thereby becoming imbedded in the underlying circuit board material. In this manner, the lead can be mechanically secured in place so that a solder bond can be subsequently accomplished without inadvertent movement of the lead.

Figure 6:
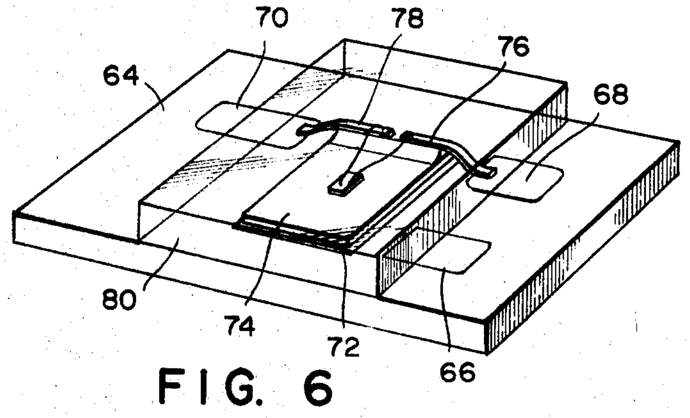
FIG. 6 is a pictorial view of a semiconductor device packaged in accordance with the invention.

In some instances it may be desirable to completely enclose the present subassembly to provide an individually encapsulated package, such as shown in FIG. 6. For ease of illustration, the encapsulant 80 is shown as being transparent, although in practice such encapsulants are usually opaque. A substrate of insulative material 64 has a plurality of conductive terminal portions 66, 68 and 70 formed near the periphery thereof, one of the terminal portions 66 being formed as part of a conductive path 72 which extends from the terminal portion to the central portion of the substrate 64, this path 72 being dimensioned to receive the subassembly package. The subassembly itself is of the type shown in FIGS. 1 and 4. The electrically conductive base member 74 of the subassembly is mounted on the conductive path 72 previously formed on the substrate and is attached thereto by soldering. Leads 76 and 78 are connected to respective terminals 68 and 70. A cover member 80 is molded or otherwise formed over the subassembly and over a portion to encapsulate the package. Thus, the subassembly package and the device mounted thereon are contained within a sealed, relatively rugged enclosure which has external connections to which the encapsulated device can be connected. Alternatively, a hollow cover member could be sealed over the subassembly in place of solid encapsulant 80.

From the foregoing it is evident that a packaging arrangement has been provided which allows efficient testing of a semiconductor device and also allows easy handling thereof for subsequent incorporation into a circuit. The novel subassembly provides a relatively rugged package which permits effective electrical and thermal attachment of a semiconductor device in planar circuits. Various modifications and alternative implementations will occur to those versed in the art without departing from the true spirit and scope of the present invention.

I claim:

1. A circuit, package comprising:

A flat base member formed of an electrically and thermally conductive material and having a surface adapted to be attached to a conductive area of a microcircuit and an opposite surface adapted to support a semiconductor device in intimate electrical and thermal contact therewith;

an electrically insulative pedestal formed on said opposite surface of said base member and having a flat surface spaced from said opposite surface of said base member;

a semiconductor device attached in intimate electrical and thermal contact on said opposite surface of said base member;

one or more elongated electrically conductive leads extending outwardly from said base member and each having first and second ends, the first end of each lead being attached to the flat surface of said pedestal and the second end being disposed outwardly from said base and adapted to be connected to a conductive area of a microcircuit;

one or more electrically conductive lead wires each having first and second ends, the first end of each lead wire being connected to the first end of a respective lead and the second end of each lead wire being connected to a respective region of said semiconductor device to provide electrical connection from said device to said leads;

said base member providing electrical connection to said semiconductor device supported thereon to function as one electrical terminal thereof and to also provide an efficient thermal structure for effective dissipation of heat from said device; and an encapsulant formed over a portion of said base member, said pedestal and said leads and fully enclosing said semiconductor device and a said lead wires.

2. A circuit package according to claim 1 wherein said pedestal is of a vitreous material.

3. A circuit package according to claim 1 wherein said pedestal is formed on said opposite surface of said base and extends along one edge thereof, and said leads extend outwardly from said base longitudinally of said edge.

4. A circuit package according to claim 1 wherein said pedestal is formed on said opposite surface of said base and extends along one edge thereof, and said leads extend outwardly from said base transversely of said edge.

5. A circuit package according to claim 1 wherein the opposite surface of said base member on which said pedestal is formed is gold plated to facilitate the attachment of a semiconductor device thereon.

6. A circuit package according to claim 1 wherein the second end of each of said one or more leads includes a prong formed therein and extending therefrom and capable of mechanically securing said lead to said conductive area to facilitate the solder connection thereof.